(12) United States Patent
Tabrizian et al.

(10) Patent No.: US 11,873,214 B2
(45) Date of Patent: Jan. 16, 2024

(54) NANO-ELECTRO-MECHANICAL TAGS FOR IDENTIFICATION AND AUTHENTICATION

(71) Applicant: University of Florida Research Foundation, Incorporated, Gainesville, FL (US)

(72) Inventors: Roozbeh Tabrizian, Gainesville, FL (US); Swarup Bhunia, Gainesville, FL (US)

(73) Assignee: University of Florida Research Foundation, Incorporated, Gainesville, FL (US)

(*) Notice: Subject to any disclaimer, the term of this patent is extended or adjusted under 35 U.S.C. 154(b) by 599 days.

(21) Appl. No.: 17/152,294

(22) Filed: Jan. 19, 2021

(65) Prior Publication Data

US 2021/0221675 A1    Jul. 22, 2021

Related U.S. Application Data

(60) Provisional application No. 62/964,014, filed on Jan. 21, 2020.

(51) Int. Cl.
| | |
|---|---|
| *B81C 1/00* | (2006.01) |
| *H10N 30/05* | (2023.01) |
| *H10N 30/06* | (2023.01) |
| *H10N 30/50* | (2023.01) |
| *H10N 30/85* | (2023.01) |
| *H10N 30/87* | (2023.01) |
| *H10N 30/093* | (2023.01) |
| *B82Y 10/00* | (2011.01) |
| *B82Y 40/00* | (2011.01) |

(52) U.S. Cl.
CPC ............ *B81C 1/0019* (2013.01); *H10N 30/05* (2023.02); *H10N 30/06* (2023.02); *H10N 30/093* (2023.02); *H10N 30/50* (2023.02); *H10N 30/85* (2023.02); *H10N 30/87* (2023.02); *B82Y 10/00* (2013.01); *B82Y 40/00* (2013.01)

(58) Field of Classification Search
CPC ........ H10N 30/87; H10N 30/85; H10N 30/50; H10N 30/06; B82Y 10/00; B82Y 40/00; B81C 1/0019
See application file for complete search history.

(56) References Cited

U.S. PATENT DOCUMENTS

| | | | |
|---|---|---|---|
| 11,569,431 B1 * | 1/2023 | Eichenfield | ........... G02F 1/0134 |
| 2012/0274647 A1 * | 11/2012 | Lan | ...................... H03H 3/0072 29/25.35 |

* cited by examiner

*Primary Examiner* — J. San Martin
(74) *Attorney, Agent, or Firm* — ALSTON & BIRD LLP

(57) ABSTRACT

A method for fabricating nano-electro-mechanical tags for identification and authentication includes, in part, forming a protective layer above a substrate, forming a first conductive layer above the protective layer serving as a first electrode, forming a piezoelectric layer above the first conductive layer, forming a second conductive layer above the piezoelectric layer, patterning the second conductive layer to form a second electrode, patterning the piezoelectric layer to expose one or more portions of the first conductive layer, and forming one or more trenches that extends into a plurality layers formed above. In addition, a sacrificial layer can be formed above portions of the substrate, and the sacrificial layer can be removed by etching to release the nano-electro-mechanical tags from the substrate.

20 Claims, 11 Drawing Sheets

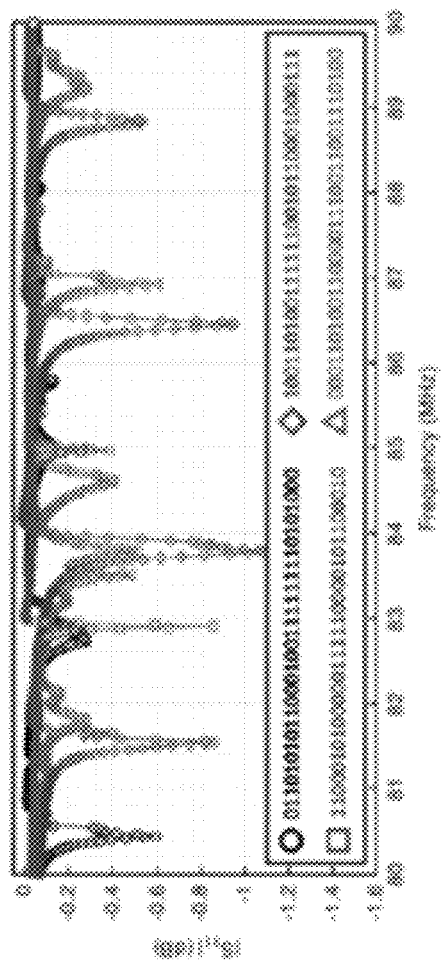
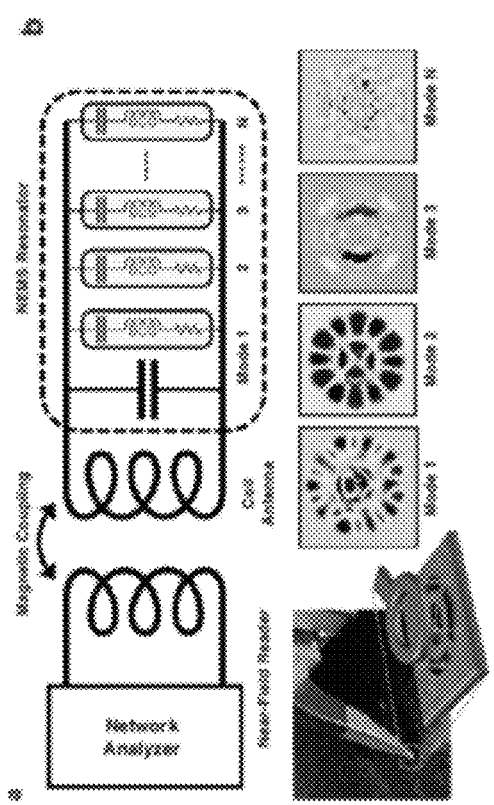
FIG. 8B
FIG. 8A

NANO-ELECTRO-MECHANICAL TAGS FOR IDENTIFICATION AND AUTHENTICATION

CROSS-REFERENCE TO RELATED APPLICATIONS

This patent application claims priority to Provisional Application Ser. No. 62/964,014, filed Jan. 21, 2020, which is incorporated herein by reference in its entirety.

TECHNICAL FIELD

The present application relates generally to the field of nano-electro-mechanical systems, and more specifically to fabrication of nano-electro-mechanical tags for identification and authentication.

BACKGROUND

Product counterfeiting has been escalating to impose broad social damages and international security threats. Besides influencing legitimate producers through imposing an unfair economical competition, counterfeiting is identified as a reciprocal promoter of organized crime and terrorism, forced or child labor, and identity theft and fraud. Product counterfeiting has been conventionally fought using physical tags that enable identification, authentication and tracking of genuine items. These tags are identified by designating a digital string to their inherent physical characteristic; hence, creating fingerprints or watermarks. Current technologies such as Universal Product Code (UPC), Quick Response patterns (QR), and radio-frequency identification tags (RFID) suffer from fundamental limitations that make them susceptible to cloning, tampering, distortion, and abolishment. For example, UPC and QR codes are required to be in the line of sight for optical read-out, which makes them easily identifiable for removal and reapplication to counterfeit products. Furthermore, availability of generators and decoders for UPC and QR barcodes facilitate their imitation at a low cost. On the other hand, the read-out scheme of RFID tags along with their low-frequency operation requires integration of large electromagnetic antennas, which makes them inappropriate for clandestine labeling.

SUMMARY

In some embodiments, the NEMS tag comprises a substrate, a protective layer, a first conductive layer, a piezoelectric layer and a second conductive layer. In some embodiments, the NEMS tag is fabricated by forming a piezoelectric layer between two metallic layers. To enhance clandestine attribute of the NEMS tag, the constituent layers, including in part the protective layer, the first conductive layer, the second conductive layer and the piezoelectric layer, are optically transparent. In some embodiments, a protective layer is formed over the substrate. In some embodiments, the protective layer is formed by an atomic layer deposition method. In some embodiments, the protective layer comprises a hafnia ($HfO_2$) layer which has a thickness of about 10 nanometers. The hafnia layer protects the consequent layers at a final release step. Alternatively, a sacrificial layer can be deposited on the substrate. In some embodiments, the substrate comprises a glass substrate, and the sacrificial layer comprises a silicon dioxide layer ($SiO_2$). In some embodiments, the first conductive layer is formed over the protective layer. The first conductive layer forms a first electrode. In some embodiments, the first conductive layer comprises a layer of indium tin oxide (ITO), which has a thickness of about 50 nanometers. The first conductive layer is sputtered over the protective layer and serves as a bottom electrode. The sputtering process of ITO is engineered to enhance electric conductivity and optical transparency of the NEMS tag. In some embodiments, the piezoelectric layer is formed over the first conductive layer. In some embodiments, the piezoelectric layer comprises a layer of scandium-doped aluminum nitride which has a thickness of about 100 nanometers. The scandium-doped aluminum nitride can be deposited over the first conductive layer. In some embodiments, along with optical transparency, the scandium-doped aluminum nitride layer provides a large electromechanical coupling coefficient, which enables efficient excitation of mechanical resonance modes with minuscule electromagnetic powers. In some embodiments, the second conductive layer is formed over the piezoelectric layer. In some embodiments, the second conductive layer is patterned to form a second electrode. Additionally, in some embodiments, the piezoelectric layer is patterned to expose one or more portions of the first conductive layer. In some embodiments, the NEMS tag is patterned to form one or more trenches, that may extend through the first conductive layer, the piezoelectric layer, and the second conductive layer. In some embodiments, the trenches may further extend through the protective layer. Further, the sacrificial layer may be removed to release the NEMS tag from the substrate. In some embodiments, the sacrificial layer is removed via an etching process. A hydrofluoric acid can be used as an etchant to remove the sacrificial layer. In some embodiments, the first conductive layer and the second conductive layer comprise a same material. In some embodiments, at least one of the first conductive layer or the second conductive layer is formed by a sputtering technique. In some embodiments, the NEMS tag uses an electromechanical spectral signature as the physical characteristic for identification. A lateral geometry of the NEMS tag is designed to ensure creation of a large set of high Q mechanical resonance modes within a frequency range of interest. In some embodiments, a coil antenna is formed above the piezoelectric layer. The coil antenna couples the second electrode to the first electrode, and enables wireless interrogation of the spectral signature of the NEMS tag. In some embodiments, the coil antenna is formed by patterning the second conductive layer.

In some embodiments, one or more resonance peaks within a spectral signature of the NEMS tag can be used to assign a binary string to the NEMS tag. In some embodiments, the one or more resonance peaks in the spectral signature of the NEMS tag are compared with a master spectral signature, and the binary string assigned to the NEMS tag can be based at least in part on frequency mismatch of the one or more resonance peaks and corresponding one or more peaks in the master spectral signature. In some embodiments, the master spectral signature can be extracted from simulation of the NEMS or from an arbitrary nano electromechanical system.

BRIEF DESCRIPTION OF THE DRAWINGS

So that the present disclosure can be understood by those of ordinary skill in the art, a more detailed description can be had by reference to aspects of some illustrative embodiments, some of which are shown in the accompanying drawings.

FIG. 8A illustrates an exemplary wireless interrogation setup and an exemplary model of a NEMS tag, in accordance with some embodiments.

FIG. 8B illustrates measured spectral signatures of four NEMS tags, in accordance with some embodiments.

Figure 1:
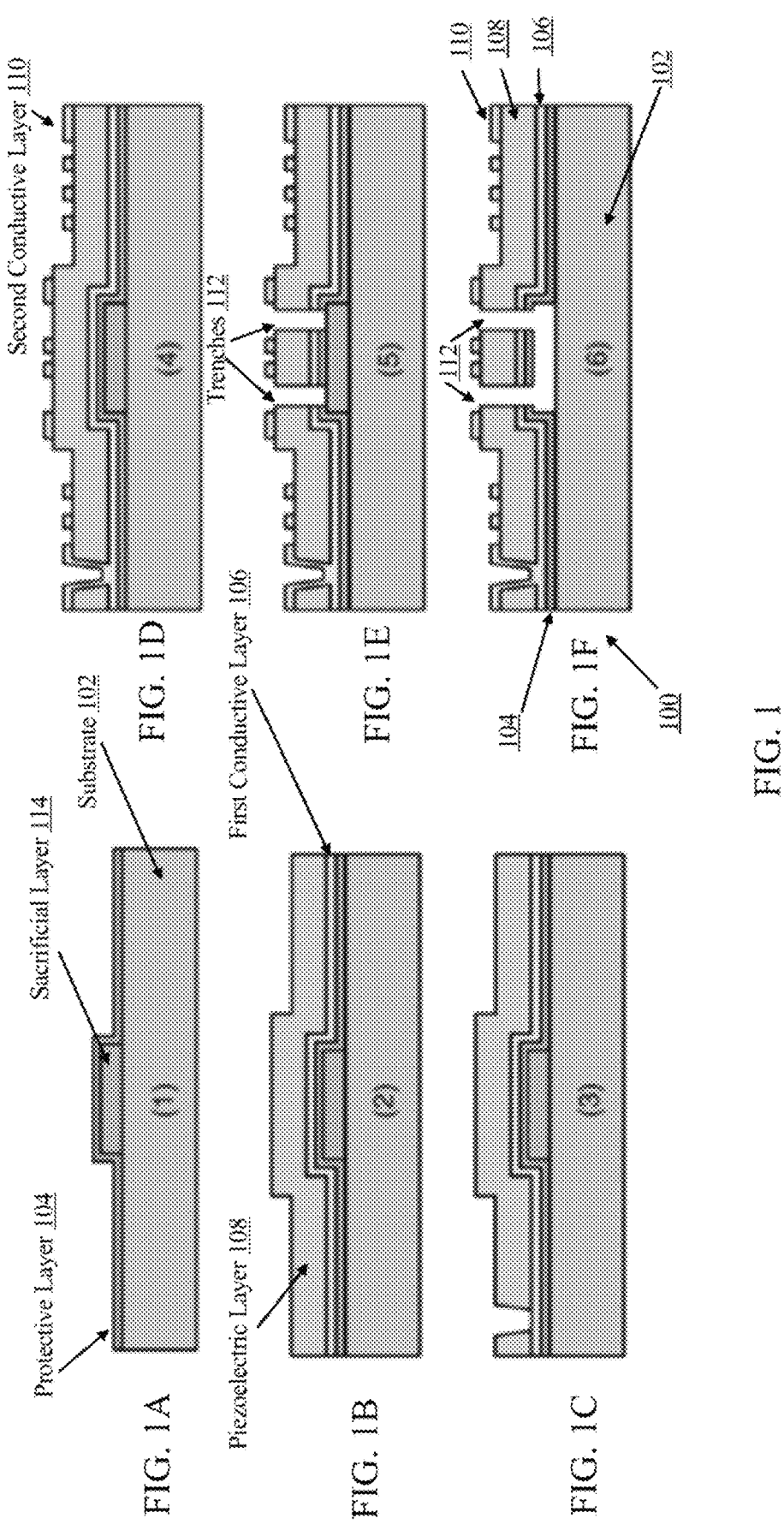
FIGS. 1A-1F illustrate various processing steps used to form a nano-electro-mechanical systems (NEMS) tag, in accordance with one embodiment.

In accordance with common practice some features illustrated in the drawings cannot be drawn to scale. Accordingly, the dimensions of some features can be arbitrarily expanded or reduced for clarity. In addition, some of the drawings cannot depict all of the components of a given system, method, or device. Finally, like reference numerals can be used to denote like features throughout the specification and figures.

DETAILED DESCRIPTION

Reference will now be made in detail to embodiments, examples of which are illustrated in the accompanying drawings. In the following detailed description, numerous specific details are set forth in order to provide a thorough understanding of some described embodiments. However, it will be apparent to one of ordinary skill in the art that some described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe some elements, these elements should not be limited by these terms. These terms are only used to distinguish one element from another. For example, a first contact could be termed a second contact, and, similarly, a second contact could be termed a first contact, without departing from the scope of the some described embodiments. The first contact and the second contact are both contacts, but they are not the same contact, unless the context clearly indicates otherwise.

The terminology used in the description of some described embodiments herein is for the purpose of describing particular embodiments only and is not intended to be limiting. As used in the description of some described embodiments and the appended claims, the singular forms "a," "an," and "the" are intended to comprise the plural forms as well, unless the context clearly indicates otherwise. It will also be understood that the term "and/or" as used herein refers to and encompasses any and all possible combinations of one or more of the associated listed items. It will be further understood that the terms "comprises," "comprising," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

It should be appreciated that in the development of any actual embodiment (as in any development project), numerous decisions must be made to achieve the developers' specific goals (e.g., compliance with system and business-related constraints), and that these goals will vary from one embodiment to another. It will also be appreciated that such development efforts might be complex and time consuming but would nevertheless be a routine undertaking for those of ordinary skill in the art of nano-electro-mechanical (or nano electromechanical) systems having the benefit of this disclosure.

Realization of unclonable identification and authentication tags is a key factor in protecting global economy from the ever-increasing counterfeit attacks. Disclosed herein is a nano-electro-mechanical tag system that exploits the electro-mechanical spectral signature as a fingerprint that is uniquified by inherent randomness in fabrication processing. Adaptive algorithms are developed for digital translation of the spectral signature into binary fingerprints. In some embodiments, a plurality of NEMS tags, fabricated in a same batch, are used to estimate the entropy of corresponding fingerprints with high accuracy. The NEMS tags are further examined under repetitive measurements and temperature variations to verify the consistency of fingerprints. Various embodiments highlight a potential of the clandestine nano-electro-mechanical tags for realization of secure identification and authentication methodology applicable to a wide range of products and consumer goods.

Nano-scale physical unclonable functions (nano-PUF) have emerged to address substantial limitations of available identification and authentication tag technologies. Nano-PUFs exploit nano-fabrication techniques for miniaturization of static patterns that represent the data. While identification, removal and reapplication of nano-PUFs impose excessive challenges and require expensive equipment, the operation principle of these tags suffer from similar shortcomings of their macro-scale counterparts, e.g., the UPC and QR labels, such as the need to be in the line of sight and unsophisticated information storage principle.

There is need for a different approach, based on nano-electro-mechanical systems (NEMS), for realization of clandestine physical tags with substantial immunity to tampering and cloning, and generic applicability to wide range of products. Disclosed NEMS tags exploit electromechanical spectral signature composed from a large set of high qualityfactor (Q) resonance peaks; hence, do not require to be in the line of sight for read-out. This principal characteristic along with ultra-miniaturized size and transparent (i.e., optically transparent) constituents, make the clandestine NEMS tags substantially immune to physical tampering and cloning. Furthermore, relying on the large Qs of mechanical resonance modes, which are about 2 to 3 orders of magnitude higher compared to electrical counterparts used in RFIDs, NEMS tags can be used in cluttered environment with large background noise and interference. Moreover, benefiting from the batch fabrication and small footprint, NEMS tags can be manufactured with low cost and used for a wide range of products. Various embodiments disclose design and implementation of clandestine NEMS tags, and their operation principle based on the use of electro-mechanical spectral signature along with mathematical algorithms for digital translation.

a. Fabrication of NEMS Tags

FIGS. 1A-1F illustrate various processing steps used to form a NEMS tag 100, in accordance with one embodiment. The NEMS tag 100 is shown as including, in part, a protective layer 104, a first conductive layer 106, a piezoelectric layer 108, a second conductive layer 110, and one or more trenches 112. In some embodiments, NEMS tag 100 is fabricated by forming a piezoelectric layer between two metallic layers. To enhance clandestine attribute of the NEMS tag 100, the constituent layers, e.g., the protective layer 104, the first conductive layer 106, the piezoelectric layer 108 and the second conductive layer 110, comprise optically transparent materials. In some embodiments, a protective layer 104 is formed over a substrate 102, as illustrated in FIG. 1A. In some embodiments, the NEMS tag 100 is implemented on a glass substrate to facilitate evaluation of the NEMS tag 100 transparency. In some embodiments, the protective layer 104 is formed by an atomic layer deposition method. In some embodiments, the protective layer 104 comprises a hafnia (HfO$_2$) layer which has a thickness of about 10 nanometers. The hafnia layer protects the consequent layers during subsequent fabrication steps. In some embodiments, a sacrificial layer 114 is deposited on the glass substrate 102 before depositing the protective layer 104, as illustrated in FIG. 1A. In some embodiments, the sacrificial layer 114 comprises a silicon dioxide layer (SiO$_2$).

In some embodiments, the first conductive layer 106 is formed over the protective layer 104, as illustrated in FIG. 1B. The first conductive layer 106 serves as a bottom electrode of the NEMS tag 100. In some embodiments, the first conductive layer 106 comprises a layer of indium tin oxide (ITO), which has a thickness of about 50 nanometers. The sputtering process of ITO is engineered to enhance electric conductivity and optical transparency of the NEMS tag 100. In some embodiments, the piezoelectric layer 108 is formed over the first conductive layer 106, as illustrated in FIG. 1B. In some embodiments, the piezoelectric layer 108 comprises a layer of scandium-doped aluminum nitride, Sc$_{0.3}$Al$_{0.7}$N, which has a thickness of about 100 nanometers. The scandium-doped aluminum nitride can be sputtered over the first conductive layer 106. In some embodiments, along with optical transparency, the scandium-doped aluminum nitride layer provides a large electromechanical coupling coefficient, which enables efficient excitation of mechanical resonance modes with minuscule electromagnetic powers. In some embodiments, the piezoelectric layer 108 is patterned to expose one or more portions of the first conductive layer 106 and to provide one or more accesses to the first conductive layer 106, as illustrated in FIG. 1C. In some embodiments, the second conductive layer 110 is formed over the piezoelectric layer 108. In some embodiments, the second conductive layer 110 is patterned to form a top electrode of the NEMS tag 100, as illustrated in FIG. 1D. In some embodiments, the patterning of the piezoelectric layer 108 can be carried out before forming the second conductive layer 110. Alternatively, the patterning of the piezoelectric layer 108 can be carried out after forming and patterning the second conductive layer 110. In some embodiments, the NEMS tag 100 is patterned by forming one or more trenches 112, and the one or more trenches 112 is formed by etching through the stack above the sacrificial layer 114, as illustrated in FIG. 1E. Further, the sacrificial layer 114 over the substrate 102 is removed to release the NEMS tag, as illustrated in FIG. 1F. In some embodiments, the sacrificial layer 114 is removed via an etching process. A hydrofluoric acid solution can be used as an etchant to remove the sacrificial layer 114. In some embodiments, during the etching process, portions of the substrate 102 may also be removed. In some embodiments, the first conductive layer 106 and the second conductive layer 110 comprise a same material. In some embodiments, at least one of the first conductive layer 106, and the second conductive layer 110 are formed by a sputtering technique. In some other embodiments, the NEMS tag may not be released from the substrate.

Figure 2:
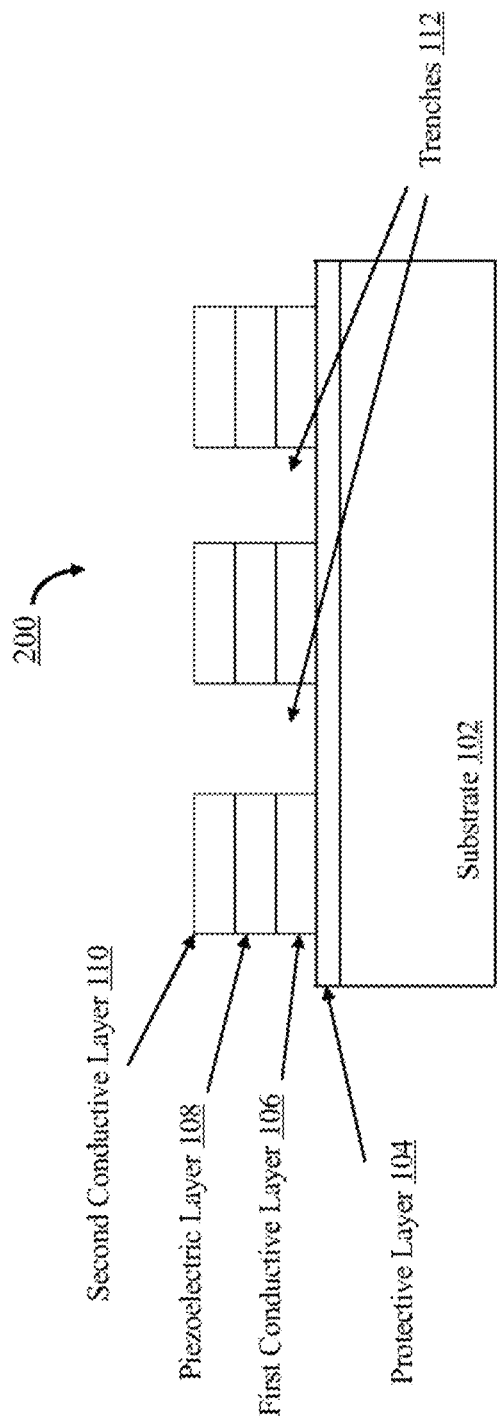
FIG. 2 is a cross-sectional view of a NEMS tag, in accordance with another exemplary embodiment.

FIG. 2 is a cross-sectional view of a NEMS tag 200, in accordance with another exemplary embodiment. In NEMS tag 200, trench(es) 112 is formed by etching through the stack above the protective layer 104. It is understood that FIG. 2 does not show the remaining elements (e.g., accesses to the first conductive layer) of the NEMS tag.

In some embodiments, the NEMS tag 100 uses an electromechanical spectral signature as the physical characteristic for identification. A lateral geometry of the NEMS tag 100 is designed to ensure creation of a large set of high Q mechanical resonance modes within a frequency range of interest.

Figure 3:
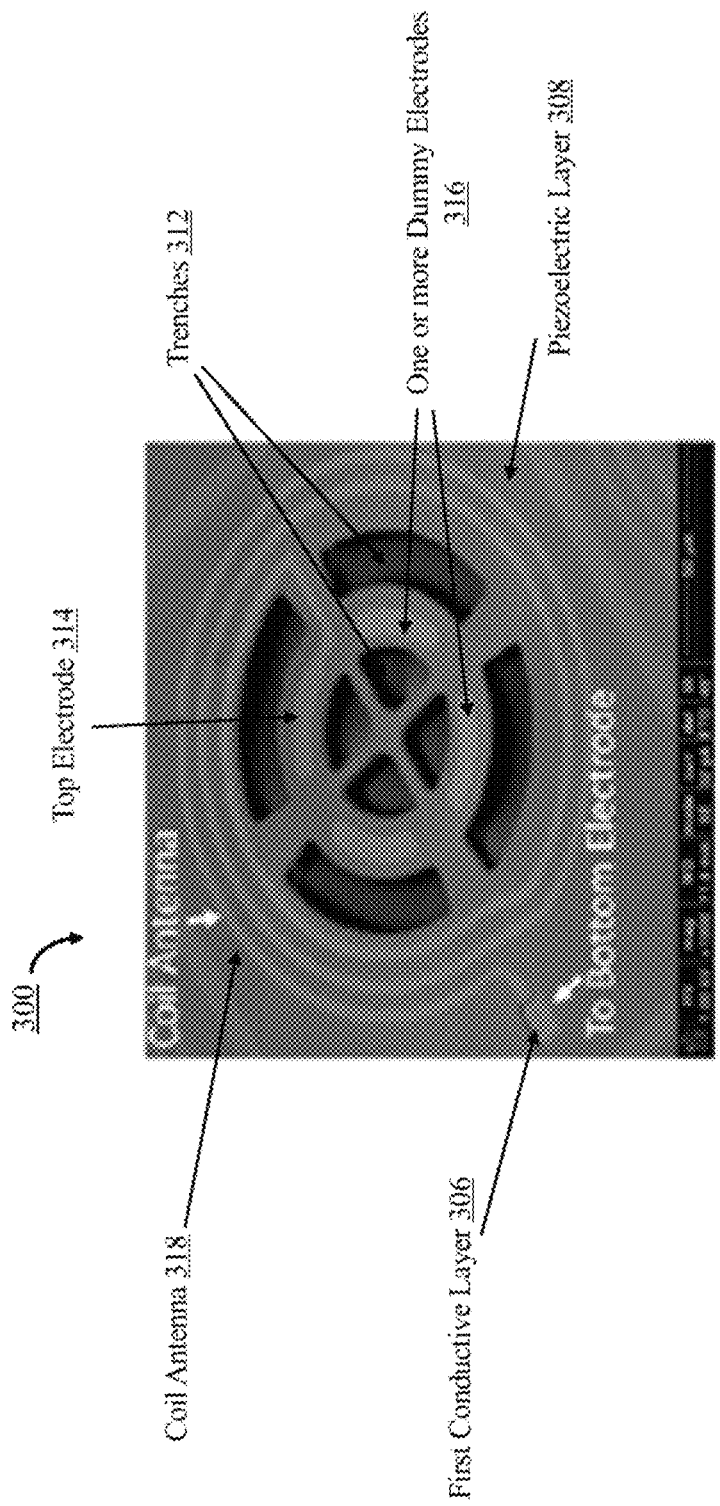
FIG. 3 illustrates a scanning electron microscope (SEM) image of an exemplary NEMS tag, in accordance with some embodiments.

FIG. 3 illustrates an SEM image of an exemplary NEMS tag 300, in accordance with some embodiments. As illustrated, the NEMS tag 300 comprises a first conductive layer 306, a top electrode 314, a piezoelectric layer 308, one or more trenches 312. In some embodiments, the piezoelectric layer 308 is patterned to expose the first conductive layer 306, and the exposed first conductive layer serves as a bottom electrode. The top electrode 314 is obtained by patterning a second conductive layer formed above the piezoelectric layer 308. In some embodiments, the NEMS tag 300 comprises one or more dummy electrodes 316. The one or more dummy electrodes 316 can help achieve structure symmetry of the NEMS tag 300. In some embodiments, the NEMS tag 300 comprises an integrated coil antenna 318. The coil antenna 318 can be formed by patterning the second conductive layer. The coil antenna 318 couples the top electrode 314 to the bottom electrode, and enables wireless interrogation of the spectral signature of the NEMS tag 300 through magnetic coupling. It is understood that FIG. 3 does not show the remaining elements (e.g., the protective layer) of the NEMS tag. A titanium layer with a thickness of about 10 nanometers is sputtered on the sample to enable high resolution SEM imaging.

Figures 4A, 4B:
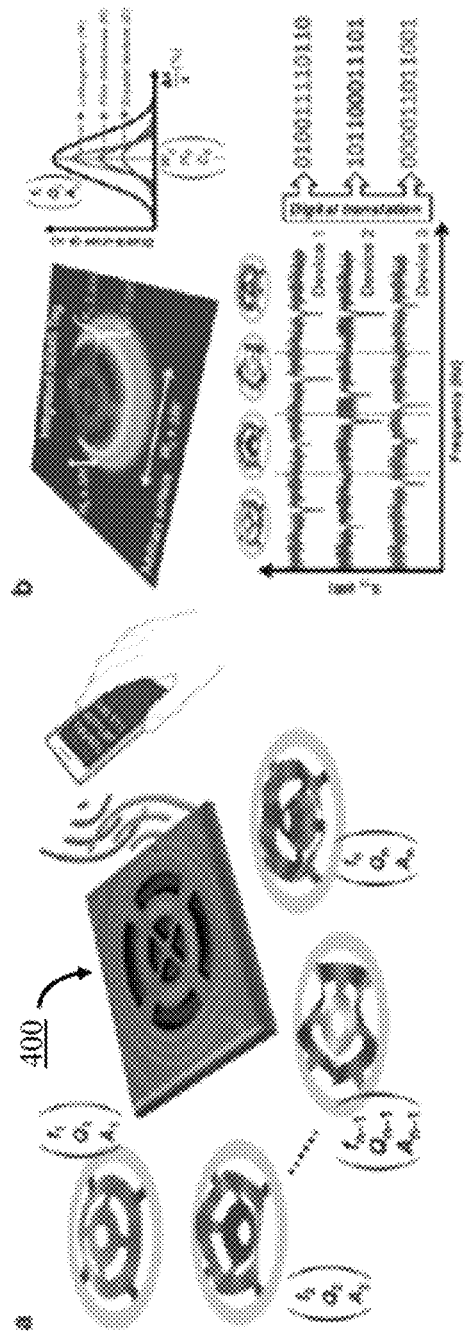
FIGS. 4A-4B illustrate an exemplary NEMS tag concept and its topography, in accordance with some embodiments.

FIGS. 4A-4B illustrate a NEMS tag concept and its topography, according to some embodiments. As shown in FIG. 4A, in some embodiments, a set of mechanical resonance modes of a NEMS tag 400 with different frequency (0, quality factor (Q), and vibration amplitude (A) are excited upon wireless interrogation. The resulting spectral signature is translated to a digital string, as illustrated in FIG. 4B. In some embodiments, a topography of a fabricated NEMS tag, integrated on a glass substrate, is illustrated in FIG. 4B. The fabrication uncertainties including film thickness variation, lithographical errors, and randomized crystal polymorphism induces inhomogeneous variations in spectral signature of NEMS tags and results in realization of digital strings unique to each NEMS tag.

Figures 5A, 5B:
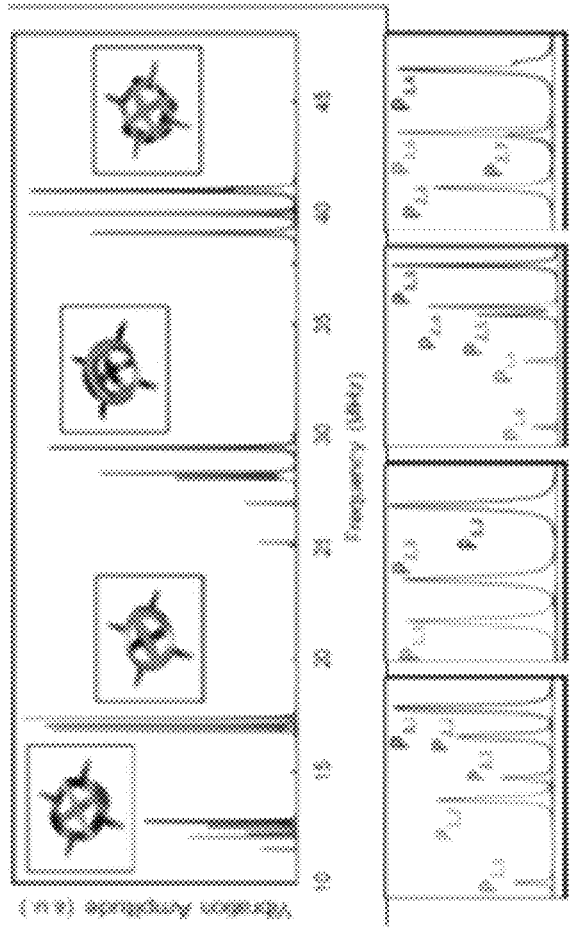
FIGS. 5A-5B illustrate simulated spectral signature of an exemplary NEMS tag, in accordance with some embodiments.

FIGS. 5A-5B illustrate simulated spectral signature of an exemplary NEMS tag, in accordance with some embodiments. In some embodiments, a large number of high Q resonance peaks is highlighted within a small frequency range over about 10 MHz to about 70 MHz. Different characteristics of the corresponding peaks to these resonance modes can be used to assign a binary string to the NEMS tag. These characteristics include the frequency, Q and amplitude of the peaks. All these characteristics are highly sensitive to the uncertainties during fabrication processing of the NEMS tag. Due to their random distribution, fabrication uncertainties enable natural creation of visually identical NEMS tag with unique and distinct fingerprints within a single batch. While such distinction cannot be identified visually, and is only reflected in the spectral signature, reverse engineering of the NEMS tag is challenging. The fabrication uncertainties that account for creation of distinct fingerprints are due to variations in device implementation, e.g., extrinsic, or inherent to material properties, e.g., intrinsic. In some embodiments, the extrinsic uncertainties include one or more of a thickness variation of the constituent films, and lithography errors in patterning electrodes and device lateral geometry. In some embodiments, the intrinsic uncertainties correspond to the variations in material properties that affect the spectral signature of the NEMS tag, which can include one or more of elastic constants, a mass density, and a crystal morphology of the constituent films. While the extrinsic uncertainties depend on the manufacturing facility used for implementation of the NEMS tag, the intrinsic uncertainties are inherent to the materials and define the ultimate entropy of the labels extracted for each tag. Specifically, the $Sc_{0.3}Al_{0.7}N$ film used for implementation of the NEMS tag provides large intrinsic uncertainties, due to purely randomized formation of the cubic conical clusters within hexagonal grains. This inherent characteristic corresponds to the tendency film morphology transition from hexagonal aluminum nitride (AlN) to cubic scandium nitride (ScN) at high concentration of scandium doping. FIG. 5B shows cubic conical clusters that are emerged after etching the hexagonal grains of $Sc_{0.3}Al_{0.7}N$, in accordance with some embodiments. Benefiting from ultra-miniaturized size of the NEMS tags, the random distribution of these clusters within the film translates to a large entropy of the corresponding binary string.

b. Translation Procedure

In some embodiments, translation procedure for generation of binary strings corresponding to a NEMS tag relies on identification of the resonance peaks within the spectral signature and the use of their frequency. The procedure starts with the identification of a master spectral signature extracted from simulations, or an arbitrary tag. The master signature is then used as a reference to extract the decimal frequency mismatch of all the peaks within the signature of the tag. In some embodiments, one or more resonance peaks are identified from a measured spectral response of the NEMS tag (i.e. the spectral signature of the NEMS tag). The frequency of the one or more resonance peaks is subtracted from one or more corresponding peaks in the simulated spectral signature (i.e. the master spectral signature), resulting in a set of decimal numbers assigned to the one or more resonance peaks. The decimal numbers are converted to binary, and cascaded to form an initial string assigned to the NEMS tag. In some embodiments, the initial binary string is shortened to a length that only contains significant bits.

Figure 6:
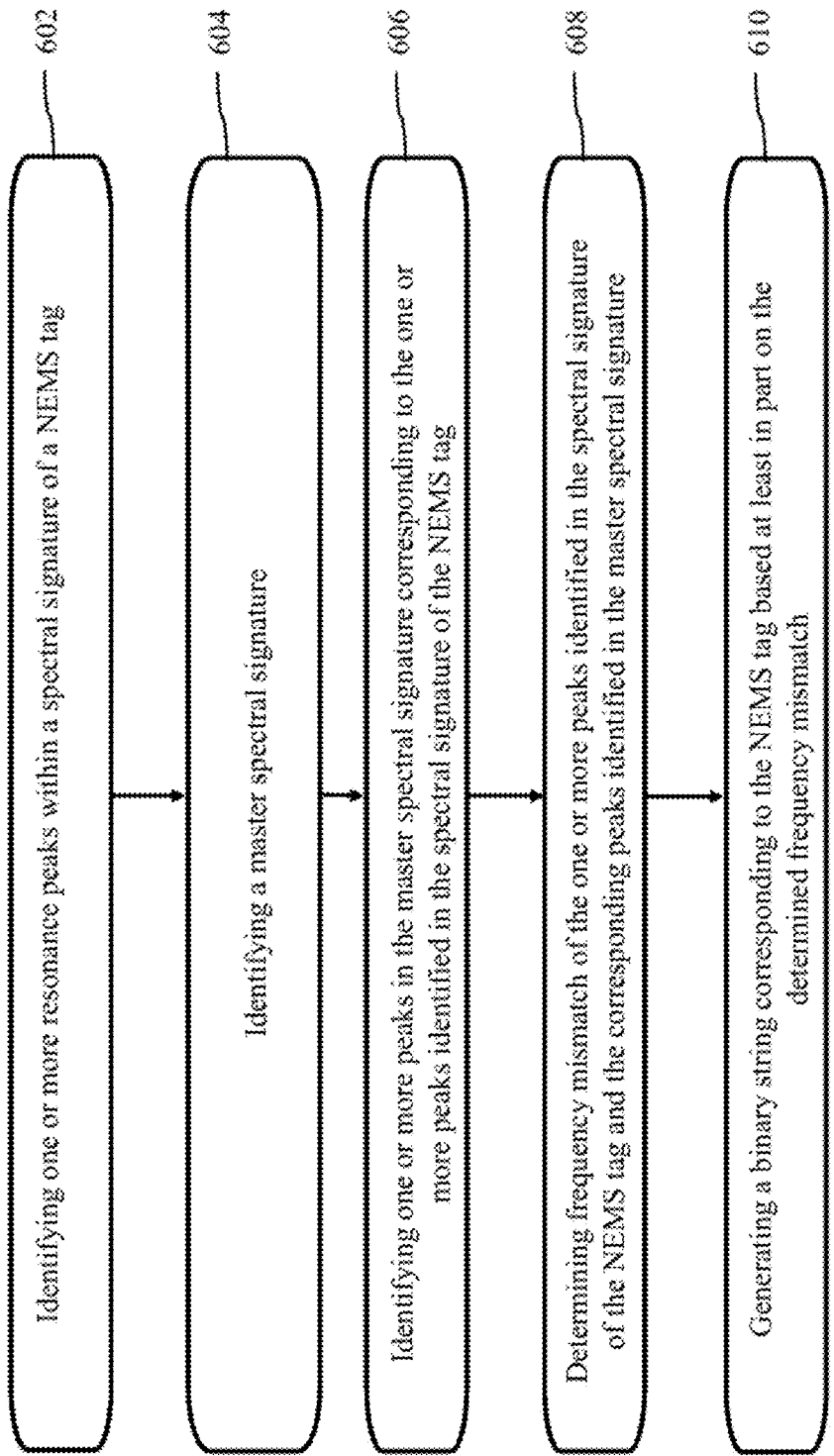
FIG. 6 illustrates an exemplary method of generating a binary string for a NEMS tag, in accordance with some embodiments.

FIG. 6 illustrates an exemplary method of generating a binary string for a NEMS tag, in accordance with some embodiments. In some embodiments, the method comprises identifying one or more resonance peaks within a spectral signature of the NEMS tag, as represented by block 602. In some embodiments, the spectral signature of the NEMS tag is a measured spectral signature of the NEMS tag. The spectral signature of the NEMS tag can be measured using a network analyzer. In some embodiments, the method comprises identifying a master spectral signature, as represented by block 604. In some embodiments, the master spectral signature can be extracted from simulation of the NEMS tag. Alternatively, in some embodiments, the master spectral signature can be extracted from a spectral signature measurement of an arbitrary NEMS tag. In some embodiments, the arbitrary NEMS tag and the NEMS tag are fabricated in the same batch. In some embodiments, the method comprises identifying one or more peaks in the master spectral signature corresponding to the one or more peaks identified in the spectral signature of the NEMS tag, as represented by block 606. In some embodiments, the method comprises determining frequency mismatch of the one or more peaks identified in the spectral signature of the NEMS tag and the corresponding peaks identified in the master spectral signature, as represented by block 608. In some embodiments, the frequency mismatch comprises a set of decimal numbers assigned to the one or more peaks identified in the spectral signature of the NEMS tag, and each decimal number represents a difference between one of the one or more peaks identified in the spectral signature of the NEMS tag and the corresponding peak in the master spectral signature. In some embodiments, the method comprises generating the binary string corresponding to the NEMS tag based at least in part on the determined frequency mismatch, as represented by block 610. In some embodiments, the binary string is generated by converting the set of decimal numbers to binary numbers (or binary substrings) and cascading them. In some embodiments, the binary string can be shortened to an optimum length that only contain significant bits. In some embodiments, the leftmost bit of each substring can be assigned to the sign of the subtraction between a peak in the master spectral signature and the corresponding peak in the spectral signature of the NEMS tag. In some embodiments, additional zeros can be added to some substrings to ensure consistent length of the substrings.

Figure 7:
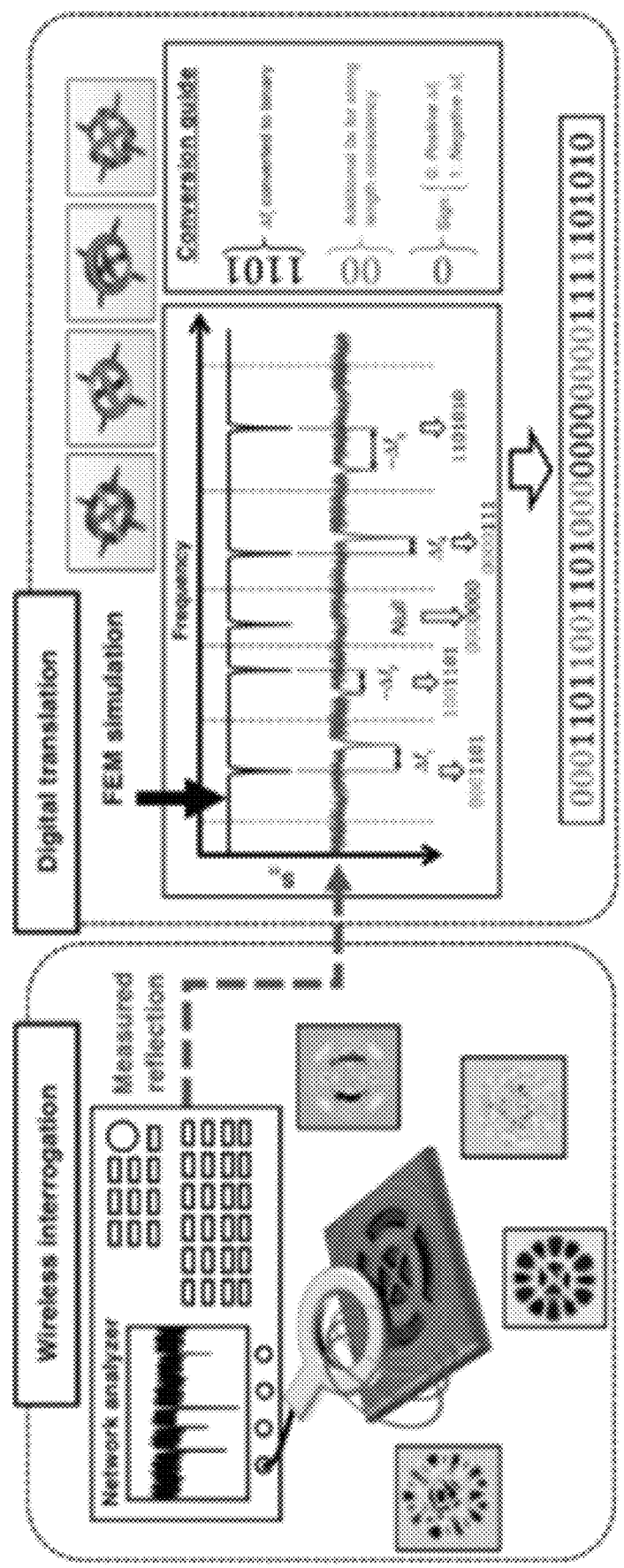
FIG. 7 is a schematic diagram of an exemplary digital translation procedure, in accordance with some embodiments.

FIG. 7 is a schematic diagram of an exemplary digital translation procedure, in accordance with some embodiments. This digital translation procedure is used to designate unique binary tags to a NEMS tag. In the procedure, the measured spectral response of the NEMS tag is compared with a reference spectral signature. In some embodiments, the reference spectral signature is generated using simulations based on a finite element method (FEM). For example, the reference spectral signature can be generated by COMSOL simulations, which provides a simulated response of the NEMS tag. In some embodiments, the comparison intervals are defined by identification of the boundaries at the average frequency of the two adjacent peaks in the simulated response. In each interval, the measured spectral response of the NEMS tag is monitored to identify the dip with the highest magnitude. In some embodiments, the frequency of this dip is then subtracted from its counterpart in the simulated reference signature. The resulting decimal value is converted to a binary string. In some embodiments, the leftmost bit of the binary string defines the sign of the resulting decimal value. In some embodiments, additional bits with 0 values are added to ensure a constant length of the binary string in each interval, regardless of the frequency offset between the simulated and measured values. In some embodiments, all zeros are assigned to an interval when there is no measured peak in the interval. In some embodiments, the binary strings corresponding to all intervals are cascaded to create the designated binary tag for the NEMS tag.

c. NEMS Tags Characterization and Statistics

In some embodiments, the spectral signatures of the NEMS tags are measured using near-field wireless interrogation. In some embodiments, the near-field wireless interrogation is over the frequency span from about 80 MHz to about 90 MHz. In some embodiments, an ICR magnetic near-field microprobe, with a coil radius of 50 μm, is positioned atop the NEMS tag to enable wireless interrogation through magnetic coupling. The microprobe is positioned at a sub-2-mm vertical distance from the tag and connected to a network analyzer to enable measurement of the reflection response (i.e., S11) over the 80-90-MHz spectrum. Prior to the measurement, a calibration procedure is carried out to de-embed the impedance-loading effect of the microprobe on the spectral response.

FIG. 8A illustrates an exemplary wireless interrogation setup and an exemplary model of a NEMS tag, in accordance with some embodiments. The model of the NEMS tag comprises an integrated coil antenna, a capacitor representing the piezoelectric transducer, and N mechanical RLC motional branches corresponding to different resonance modes. In FIG. 8A, the inset shows the optical image of the device under test, as well as the corresponding vibration patterns at different resonance frequencies extracted using optical probing. To enhance the wireless interrogation resolution, the static response corresponding to the electrical feedthrough induced by the magnetic coupling coils and piezoelectric film capacitor is de-embedded using non-released NEMS tags.

Figure 8C:
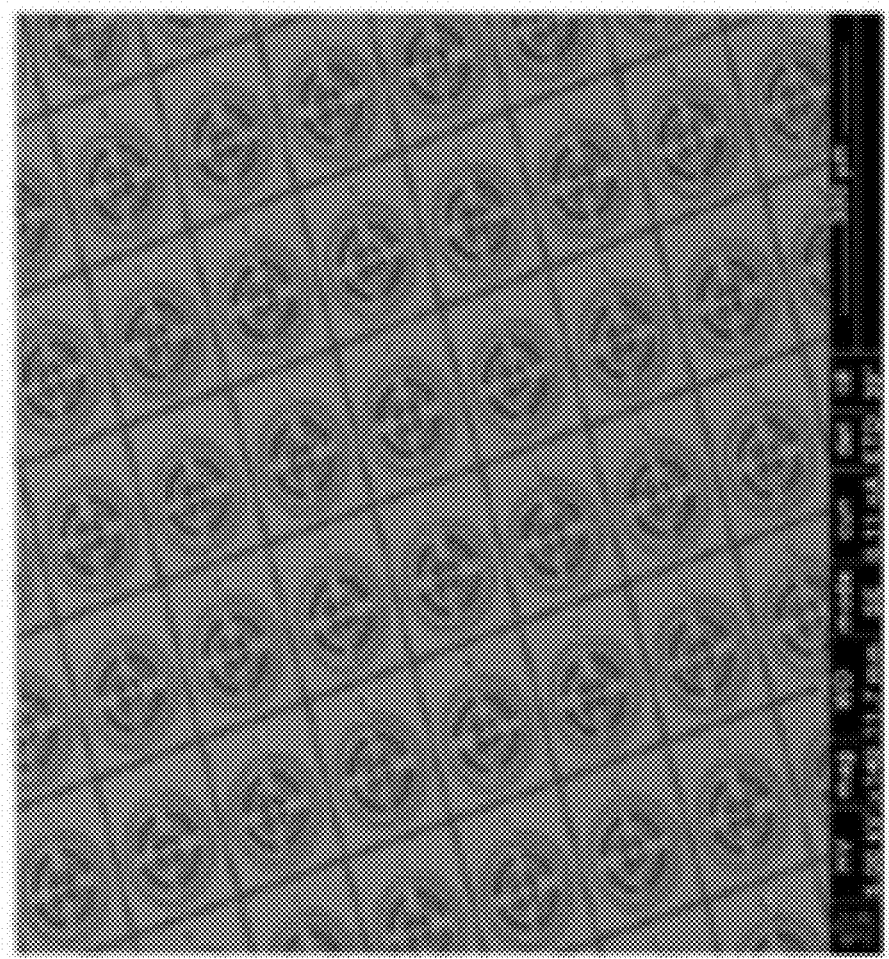
FIG. 8C illustrates an SEM image of an array of NEMS tags, in accordance with some embodiments.

FIG. 8B illustrates measured spectral signatures of four NEMS tags, in accordance with some embodiments. The four NEMS tags are randomly picked from an array of NEMS tags with the same layouts implemented in the same batch on a glass of substrate. FIG. 8C illustrates an SEM image of the array of NEMS tags. As illustrated in FIG. 8B, the significant distinction between the vibration patterns corresponds to the different surface and bulk acoustic waves that create the resonance modes. This distinction is responsible for the highly randomized effect of intrinsic and extrinsic uncertainties on the spectral signature of the NEMS tags. FIG. 8B also shows the corresponding binary labels for the four tags extracted using the digital translation procedure. The 31-bit string assigned to the spectral signature fingerprints highlights the large entropy of the clandestine NEMS technology, which makes it suitable for identification, authentication, and tracking applications.

Figures 9A, 9B:
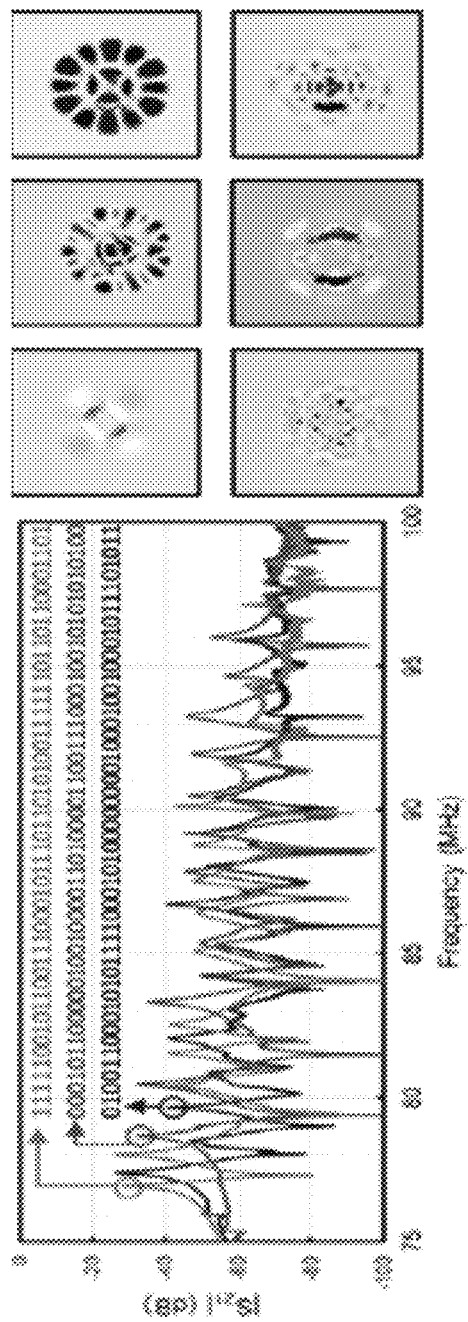
FIGS. 9A-9B illustrate measured spectral signature of another three NEMS tags, in accordance with some embodiments.

FIGS. 9A-9B illustrate measured spectral signature of another three NEMS tags, in accordance with some embodiments. In some embodiments, the spectral signature of the NEMS tag is measured using contact probes and a vector network analyzer to enable measurement of the transmission response (i.e., S21) over the spectrum from about 75 MHz to about 100 MHz. FIG. 9A compares the frequency response of three different NEMS tags with the same layouts, which are fabricated in the same batch. FIG. 9B shows corresponding vibration patterns at different resonance frequencies which are extracted using optical probing. In some embodiments, a 54-bit string is designated to the spectral signature fingerprints of each NEMS tag to highlight the large entropy of the clandestine NEMS tag to enable the NEMS tag for identification, authentication, and tracking applications. To quantify the entropy, a plurality of NEMS tags with identical designs are used. The inter-device Hamming distance is used as a metric to measure uniqueness of the binary strings corresponding to spectral signatures.

Figure 10B:
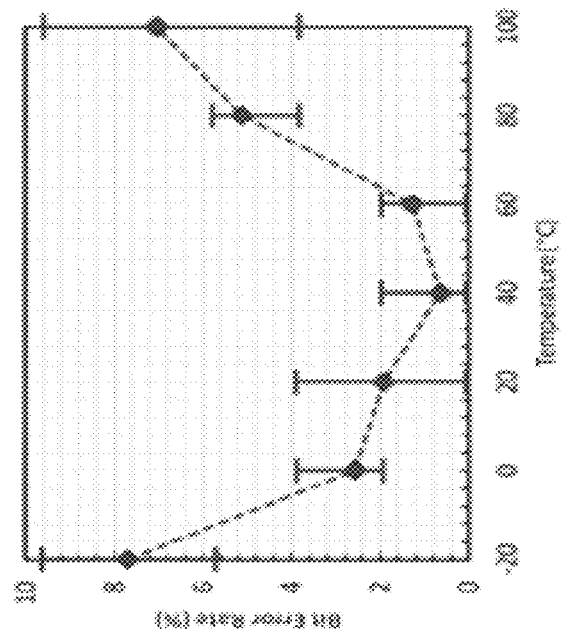
FIGS. 10A-10B illustrate extracted histogram for the inter-device Hamming distance for the NEMS tags and the bit error rate for the NEMS tags at different temperatures respectively, in accordance with some embodiments.
Figure 10A:
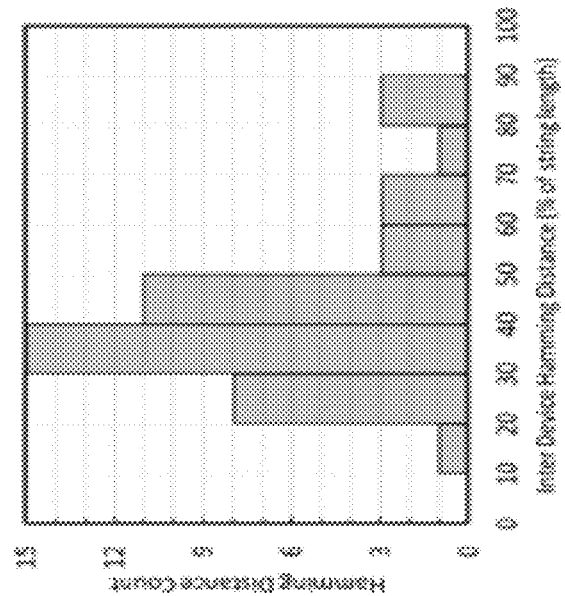

FIG. 10A illustrate extracted histogram for the inter-device Hamming distance for the NEMS tags, in accordance with some embodiments. The Hamming distance is extracted from a group of ten identical NEMS tags. The NEMS tags are also measured at across temperature variations to identify their environmental robustness. The temperature sensitivity of material properties and device dimensions results in finite variation of the frequency of mechanical resonance modes. To quantify the effect of temperature variation on the extracted binary strings, the plurality of NEMS tags are measured over a temperature range from about −20° C. to 100° C., in 20° C. increments, and their corresponding binary string are compared to extract the bit error rate (BER). In some embodiments, the temperature characterization is performed on a single device and in three consecutive cycles to further evaluate robustness of the binary NEMS tags over repeated measurements. FIG. 10B shows the average BER at different temperatures, in accordance with some embodiments. The error bar at each data point shows the distribution of the BER over the three measurement cycles. A BER lower than about 8% is measured over −20° C. to 100° C., which highlights the temperature stability of the NEMS tags for practical applications. Furthermore, the BER variation across measurement repetition is smaller than about ±3% over the entire temperature range, which indicates the robustness of the NEMS tags. The temperature stability, despite the sensitivity of the resonance frequencies, is attributed to the consistent temperature coefficient of frequency (TCF) of the peaks, e.g., a TCF between about −32 ppm/° C. and about −34 ppm/° C. across the entire group NEMS tags. This results in an equal fractional shift in the frequency of peaks, which does not affect the extracted binary string considering the spectral normalization used in the digital translation procedure.

The invention claimed is:

1. A method for fabricating a nano electromechanical system (NEMS), the method comprising:
    forming a protective layer above a substrate;
    forming a first conductive layer above the protective layer, wherein the first conductive layer forms a first electrode;
    forming a piezoelectric layer above the first conductive layer;
    forming a second conductive layer above the piezoelectric layer;
    patterning the second conductive layer to form a second electrode; and
    forming one or more trenches that extends through the first conductive layer, the piezoelectric layer and the second conductive layer, wherein the protective layer, the first and second conductive layers and the piezoelectric layer are optically transparent.

2. The method of claim 1 further comprising patterning the piezoelectric layer to expose one or more portions of the first conductive layer.

3. The method of claim 1, wherein the one or more trenches further extends through the protective layer.

4. The method of claim 1, wherein at least one of the first conductive layer or the second conductive layer is formed by a sputtering technique.

5. The method of claim 1, wherein at least one of the first conductive layer or the second conductive layer has a thickness of about 50 nanometers.

6. The method of claim 1, wherein the protective layer comprises hafnia ($HfO_2$).

7. The method of claim 1, wherein the protective layer is formed by an atomic layer deposition technique.

8. The method of claim 1, wherein the protective layer has a thickness of about 10 nanometers.

9. The method of claim 1, wherein the piezoelectric layer comprises scandium-doped aluminum nitride ($Sc_{0.3}Al_{0.7}N$).

10. The method of claim 1, wherein the piezoelectric layer has a thickness of about 100 nanometers.

11. The method of claim 1 further comprising releasing the NEMS from the substrate.

12. The method of claim 11 further comprising forming a sacrificial layer positioned above portions of the substrate and between the substrate and the protective layer, wherein the sacrificial layer comprises a silicon dioxide layer.

13. The method of claim 12, wherein the releasing of the NEMS from the substrate comprises removing the sacrificial layer through etching in a hydrofluoric acid solution.

14. A nano electromechanical system (NEMS) comprising:
a substrate;
a protective layer positioned above the substrate;
a first conductive layer positioned above the protective layer and forming a first electrode;
a piezoelectric layer positioned above the first conductive layer;
a second conductive layer positioned above the piezoelectric layer and patterned to form a second electrode; and
one or more trenches extending through the first conductive layer, the piezoelectric layer, and the second conductive layer, wherein the protective layer, the first conductive layer, the second conductive layer and the piezoelectric layer are optically transparent.

15. The NEMS of claim 14, wherein at least one of the first conductive layer or the second conductive layer comprises indium tin oxide (ITO).

16. The NEMS of claim 14, wherein the one or more trenches further extends through the protective layer.

17. The NEMS of claim 14, wherein the protective layer comprises hafnia ($HfO_2$).

18. The NEMS of claim 14, wherein the piezoelectric layer comprises scandium-doped aluminum nitride ($Sc_{0.3}Al_{0.7}N$).

19. The NEMS of claim 14 further comprising a coil antenna coupling the second electrode to the first electrode.

20. The NEMS of claim 14 wherein said NEMS is used to generate a binary string by:
identifying one or more resonance peaks within a spectral signature of the NEMS;
identifying a master spectral signature;
identifying one or more peaks in the master spectral signature corresponding to the one or more peaks identified in the spectral signature of the NEMS tag;
determining frequency mismatch of the one or more peaks identified in the spectral signature of the NEMS tag and the corresponding peaks identified in the master spectral signature; and
generating the binary string based at least in part on the determined frequency mismatch.

* * * * *